United States Patent [19]
Kikuchi et al.

[11] Patent Number: 5,070,408
[45] Date of Patent: Dec. 3, 1991

[54] FOCUSING APPARATUS AND DIGITAL FILTERS FOR USE THEREWITH

[75] Inventors: Akihiro Kikuchi, Chiba; Tokuya Fukuda, Tokyo, both of Japan

[73] Assignee: Sony Corporation, Tokyo, Japan

[21] Appl. No.: 523,568

[22] Filed: May 15, 1990

[30] Foreign Application Priority Data

May 19, 1989 [JP] Japan .................................. 1-127560
May 29, 1989 [JP] Japan .................................. 1-135351

[51] Int. Cl.$^5$ ........................................... H04N 5/232
[52] U.S. Cl. .................................... 358/227; 358/209; 358/225
[58] Field of Search ............... 358/227, 228, 225, 209, 358/169, 213.19; 354/400, 402, 404; 364/274.01, 274.16

[56] References Cited

U.S. PATENT DOCUMENTS

| | | | |
|---|---|---|---|
| 4,544,953 | 10/1985 | Goldman | 358/227 |
| 4,833,541 | 5/1989 | Takuma et al. | 358/227 |
| 4,903,134 | 2/1990 | Murashima et al. | 358/227 |
| 4,967,279 | 10/1990 | Murashima | 358/227 |
| 4,967,280 | 10/1990 | Takuma et al. | 358/227 |
| 4,975,726 | 12/1990 | Kuga et al. | 354/402 |

FOREIGN PATENT DOCUMENTS

0263510 4/1988 European Pat. Off. .
0266072 5/1988 European Pat. Off. .

*Primary Examiner*—James J. Groody
*Assistant Examiner*—Tuan V. Ho
*Attorney, Agent, or Firm*—Alvin Sinderbrand; William S. Frommer

[57] ABSTRACT

A lens focusing system in which predetermined signal components in a video signal are detected for focusing an image by maximizing the predetermined signal components, includes a lens for focusing an image on an image pickup device operative to convert light from the lens into electric signals; a signal processing circuit for processing the output electric signals from the image pickup device to obtain video signals; a filter which has a transfer characteristic approximating that of a lens system which is out of focus; and a subtracting circuit for eliminating video signal components which pass through the filter from the electric signals output by the image pickup device. Novel digital filters particularly adapted for use with such lens focusing systems also are provided.

17 Claims, 12 Drawing Sheets

FOCUSING APPARATUS AND DIGITAL FILTERS FOR USE THEREWITH

BACKGROUND OF THE INVENTION

2. Field of the Invention

The present invention generally relates to lens focusing systems, such as the lens focusing system of a video camera, and novel digital filters particularly adapted for use with such focusing systems.

2. Description of the Prior Art

A known video camera auto-focusing system operates on the principle that the frequency components (excluding the DC component) of the video signal are at a maximum when the camera is in focus. In the known system, the frequency components of the video signal, with the exception of the DC component, of the video signal are integrated to yield an evaluation signal and the position of the lens is set to the position at which the evaluation signal reaches a maximum value, whereupon the system is in focus. The maximum value of the evaluation signal is detected by comparing sequential evaluation signals to determine whether the evaluation signal is changing from an increasing state to a decreasing state. Such a control technique is referred to as peak detecting control.

FIG. 1 illustrates an example of a conventional auto-focusing circuit of a video camera in accordance with such a system. In FIG. 1, a lens 201 is movable by a drive motor 202. An image which is transmitted through the lens 201 is converted to an electrical signal by an image pickup device 203, such as a charge coupled device (CCD). An output of the image pickup device 203 is supplied to a signal processing circuit 204 which produces a luminance signal Y therefrom and supplies the luminance signal to a detecting circuit 206 through a filter 205 which passes the frequency components of the luminance signal Y with the exception of any DC component therein. An output of the detecting circuit 206 is supplied to an A/D converter 207. An output of the A/D converter 207 is supplied to an integrating circuit 208 which is operative to integrate those portions thereof which represent a predetermined area of the image in the camera's viewfinder, thereby to provide an evaluation signal which is then supplied to a controller 210. The controller 210 controls a drive signal provided to the drive motor 202 by a driver circuit 211 to adjust the position of the lens 20 until the evaluation signal output from the integrating circuit 208 reaches a maximum. To do so, the controller 210 employs a peak detecting control technique, as described hereinbelow.

An exemplary relationship between lens position and the resulting evaluation signal is indicated by the curve provided in FIG. 2. As the lens 201 is moved from a position 1n to a position 1n+1, the evaluation signal Dn which is obtained at the position $1_n$ is compared with an evaluation signal $D_{n+1}$ which is obtained at the subsequent position $1_{n+1}$. The lens 201 is moved until the evaluation signal $D_n$ which is obtained at a prior lens position $1_n$ is larger than the evaluation signal $D_{n+1}$ which is obtained at a lens position $1_{n+1}$ which is achieved subsequent to the position $1_n$.

As shown in FIG. 2, when the lens position is moved to the right, the evaluation signal increases until the lens has passed a lens position $1_{focus}$ us at which the evaluation signal reaches a maximum value $D_{max}$. When the lens has passed the lens position $1_{focus}$ at which the evaluation signal reaches its maximum value, the evaluation signal begins to decrease. The peak detecting control technique determines when the evaluation signals $D_n$ and $D_{n+1}$ at two sequential lens positions $1_n$ and $1_{n+1}$ change from an increasing state to a decreasing state while moving the lens position in a given direction. In such manner, it can be determined that the lens has reached the lens position $1_{focus}$ at which the evaluation signal reaches its maximum value $D_{max}$, so that an in-focus position is attained.

Hitherto, a third order analog Chebyshev approximated filter has been used as the filter 205 to eliminate the DC component from the video signal in the conventional signal auto-focusing circuit. FIG. 3 illustrates evaluation signal characteristics of the conventional auto-focusing circuit using such an analog filter.

As shown in FIG. 3, in such a conventional auto-focusing circuit, the inclination of the characteristic curve of the evaluation signal is not constant. When the lens position is far from the in-focus position $1_{focus}$, the inclination of the characteristic curve is nearly eliminated. Accordingly, as shown in FIG. 3, in the case where the initial position of the lens is far from the in-focus position, for example, at the location $1_p$, the difference between the evaluation signal at the lens position $1_p$ and the evaluation signal at a lens position $1_{p+1}$ which is close to the lens position $1_p$ is very small, so that it is difficult under these conditions to achieve an in-focus state.

In order to make it possible to position the lens so that the system is in-focus, even when the initial position of the lens is far from the in-focus position shown in FIG. 3, the overall gain of the circuit may be increased to increase the inclination of the evaluation signal curve when the initial location of the lens is far from the in-focus position. However, a wide dynamic range is then required which is difficult to implement.

OBJECTS AND SUMMARY OF THE INVENTION

Accordingly, it is an object of this invention to provide an improved focusing control system which avoids the above-mentioned disadvantages and problems associated with the prior art.

Another object of the invention is to provide an improved focusing apparatus for a lens system utilizing peak detecting control means which need not possess a wide dynamic range.

It is a further object of this invention to provide a circuit for a lens system which produces a focusing signal having a characteristic approximating an ideal characteristic curve.

It is a still further object of this invention to provide novel digital averaging filters which are relatively simple to construct and are particularly advantageous for use in a lens system for providing a focusing signal.

It is a yet another object of the present invention to provide such novel digital averaging filters which are adapted for achieving high operating speeds.

In accordance with an aspect of the present invention, a focusing control apparatus for a video camera in which middle high frequency components in a video signal are detected for focusing by maximizing the middle high frequency components comprises lens means for focusing an image; motive means for moving the lens means; image pickup means for converting light from the lens means into electrical signals; signal processing means for processing the electrical signals from the image pickup means to obtain analog luminance signals; analog to digital converter means for converting analog luminance signals from the signal processing means into digital luminance signals; filter means comprising a low pass filter for imparting characteristics to the digital luminance signals approximately corresponding to characteristics of the image produced when the lens is out of focus, and subtracting means for eliminating signal components which pass through such low pass filter from the digital luminance signals to produce a filtered output signal; detecting means for detecting the level of the filtered output signal of the subtracting means; integrating means for integrating an output signal of the detecting means; driving means for driving the motive means based on a control signal; and control means for providing the control signal to the driving means such that the driving means drives the motive means to position the lens means to maximize the output signal of the integrating means.

In accordance with another aspect of the present invention, a system for providing a focusing signal for use with a lens system having a lens adapted to be positioned for focusing an image transmitted therethrough comprises image pickup means for converting an image from the lens into video signals; and signal filtering means for producing the focusing signal based on the video signal by substantially eliminating from the video signal low frequency components thereof which represent components of the image produced by the lens system when it is out of focus.

In accordance with a further aspect of the present invention, a digital signal filter for filtering a digital input signal comprises means for producing a first digital signal proportional to a difference between the digital input signal and a preceding value of the digital input signal delayed in time by (2m+1) sample periods with respect to the digital input signal, where (m) is an integer; means for integrating the first digital signal to produce a second digital signal; means for producing a third digital signal proportional to a value of the digital input signal delayed in time by (m) sample periods with respect to the digital input signal and multiplied by a coefficient (2m+1); and means for adding the second digital signal and the third digital signal to produce a filtered digital output signal.

In accordance with a still further aspect of the present invention, a digital filter for filtering a digital input signal comprises means for producing a first digital signal proportional to a difference between the digital input signal and a preceding value of the digital input signal delayed in time by (2m+1) sample periods with respect to the digital input signal; means for integrating the first digital signal to produce a second digital signal; means for producing a third digital signal proportional to a value of the second digital signal delayed in time by one sample period; means for producing a fourth digital signal proportional to a value of the digital input signal delayed in time by (m+1) sample periods with respect to the digital input signal and multiplied by a coefficient (2m+1); and adding means for adding the third digital signal and the fourth digital signal to produce a filtered digital output signal.

In accordance with yet another aspect of the present invention, a digital signal filter for filtering a digital input signal comprises means for producing a first digital signal proportional to a difference between the digital input signal and a preceding value of the digital input signal delayed in time by (2m) sample periods with respect to the digital signal input, where (m) is an integer; means for integrating the first digital signal to produce a second digital signal; means for producing a third digital signal proportional to (m) times a sum of a value of the digital input signal delayed by (m−1) sample periods and a value of the input digital signal delayed by (m) sample periods; and adding means for adding the second digital signal and the third digital signal to produce a filtered digital output signal.

In accordance with still another aspect of the present invention, a digital signal filter for filtering a digital input signal comprises means for producing a first digital signal proportional to a difference between the digital input signal and a preceding value of the digital input signal delayed in time by (2m) sample periods with respect to the digital input signal, where (m) is an integer; means for integrating the first digital signal to produce a second digital signal; means for producing a third digital signal proportional to a value of the second digital signal delayed in time by one sample period; means for producing a fourth digital signal proportional to a sum of a value of the digital input signal delayed by (m+1) sample periods multiplied by a coefficient (m) and a value of the digital input signal delayed by (m) sample periods multiplied by a coefficient (m); and adding means for adding the third digital signal and fourth digital signal to produce a filtered digital output signal.

The above, and other objects, features and advantages of the invention, will be apparent in the following detailed description of certain illustrative embodiments thereof which is to be read in connection with the accompanying drawings forming a part hereof, and wherein corresponding parts and components are identified by the same reference numerals in the several views of the drawings.

DETAILED DESCRIPTION OF THE PREFERRED EMBODIMENTS

Focusing Apparatus

Figure 1:
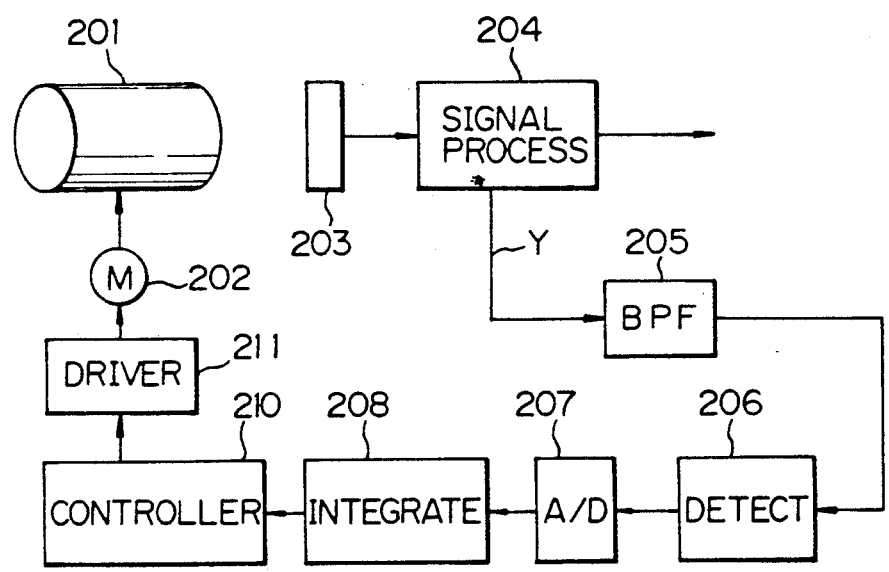
FIG. 1 is a block diagram of an exemplary conventional auto-focusing circuit.
Figure 2:
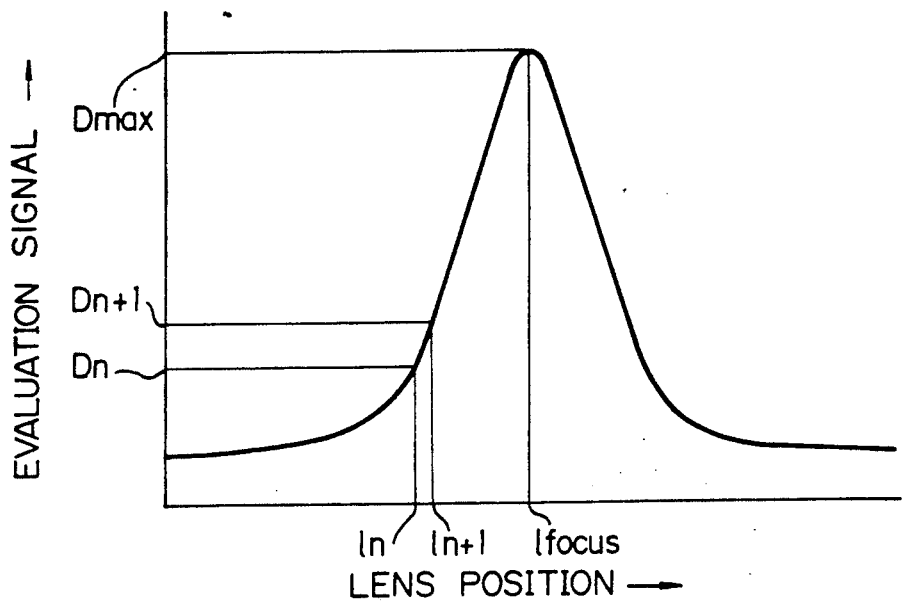
FIGS. 2 and 3 are graphs for use in explaining the operation of the conventional auto-focusing circuit of FIG. 1.
Figure 3:
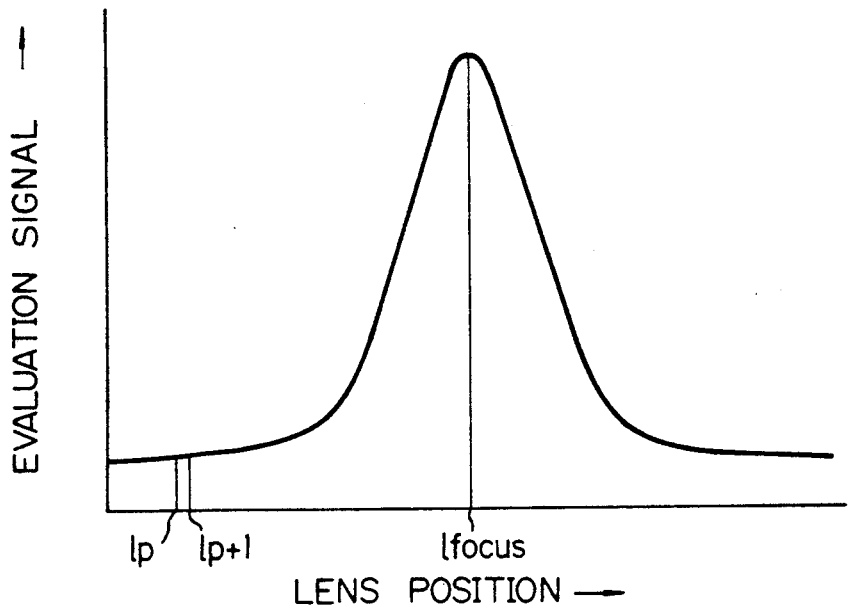
Figure 4:
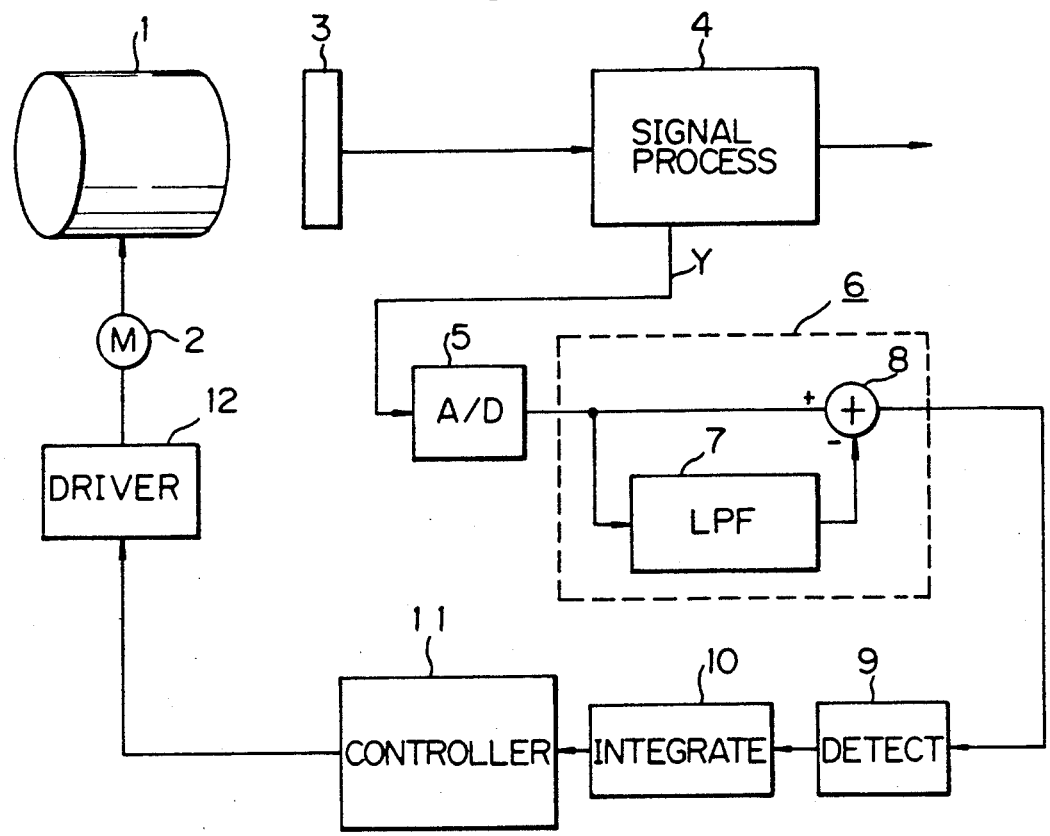
FIG. 4 is a block diagram of a focusing system in accordance with one embodiment of the present invention.

With reference first to FIG. 4, a focusing system in accordance with an embodiment of the present invention is there illustrated in which a lens 1 for focusing an image is movable with respect to a CCD image pickup device 3 by means of a drive motor 2. An optical image transmitted through the lens 1 is incident on image pickup device 3 which is operative to produce a corresponding electrical signal at an output thereof. The output of the CCD image pickup device 3 is supplied to a signal processing circuit 4 which produces a luminance signal Y therefrom. The luminance signal Y is supplied to an A/D converter 5 which converts it to a digital signal which is then supplied to a filter circuit 6.

The filter circuit 6 comprises an out-of-focus approximating low pass filter 7 and a subtracting circuit 8. The out-of-focus approximating low pass filter 7 has a transfer characteristic which approximates that of a lens system which is out-of-focus so that an image passing therethrough loses its high frequency components. Accordingly, low pass filter 7 is operative to attenuate the high frequency components of the luminance signal Y to produce a low pass filtered signal representing components of the optical image incident on image pickup device 3 when the lens 1 is positioned such that it is out of focus. When the output of the low pass filter 7 is subtracted from the luminance signal Y by the subtracting circuit 8, the low frequency components thereof representing the image components present when lens 1 is out of focus are substantially eliminated from the luminance signal Y. Several embodiments of the filter circuit 6 will be described in greater detail hereinafter.

An output signal from the filter circuit 6 is supplied to a detecting circuit 9 which detects the level of said output signal and provides a corresponding detection output signal to an integrating circuit 10 which is operative to integrate those portions of such detection output signal corresponding to a predetermined area of the optical image incident on the image pickup device 3.

An output of the integrating circuit 10 is an evaluation signal which is supplied to a controller 11. The driver 12 is operative to supply power to the drive motor 2 based on a control signal from the controller 11 determined by the evaluation signal from the integrating circuit 10.

The controller 11 adjusts the position of the lens 1 to that at which the evaluation signal output from the integrating circuit 10 reaches a maximum. The controller 11 utilizes a peak detecting control technique according to which, when the lens 1 is moved in one direction, the evaluation signals at sequential lens positions are compared to thereby detect the lens position at which the evaluation signals change from an increasing state to a decreasing state, thereby indicating that the system is in focus.

Figure 5:
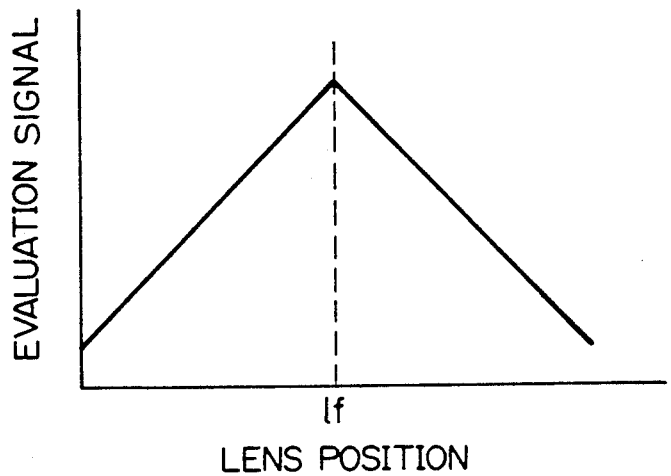
FIG. 5 is a graph for use in explaining the operation of the embodiment of FIG. 4.

In such a peak detecting control apparatus, it is desired that the inclination of the characteristic curve of the evaluation signal be almost constant. Such a desired characteristic curve is shown in FIG. 5 wherein the abscissa denotes lens position, the ordinate indicates the corresponding evaluation signal level and $1_f$ represents an in-focus position of the lens.

In accordance with certain embodiments of the present invention, the out-of-focus approximating low pass filter 7 of the filter circuit 6 advantageously comprises a digital averaging low pass filter, but it will be appreciated that the filter 7 may take other forms as well. Where the evaluation signal is obtained with the use of the filter 6 comprising the out-of-focus approximating low pass filter 7 and the subtracting circuit 8, the characteristic curve of the resulting evaluation signal approaches an ideal curve as shown in FIG. 5, that is the characteristic curve is one in which the inclination is almost constant.

First Embodiment of a Filter Circuit

Figure 6:
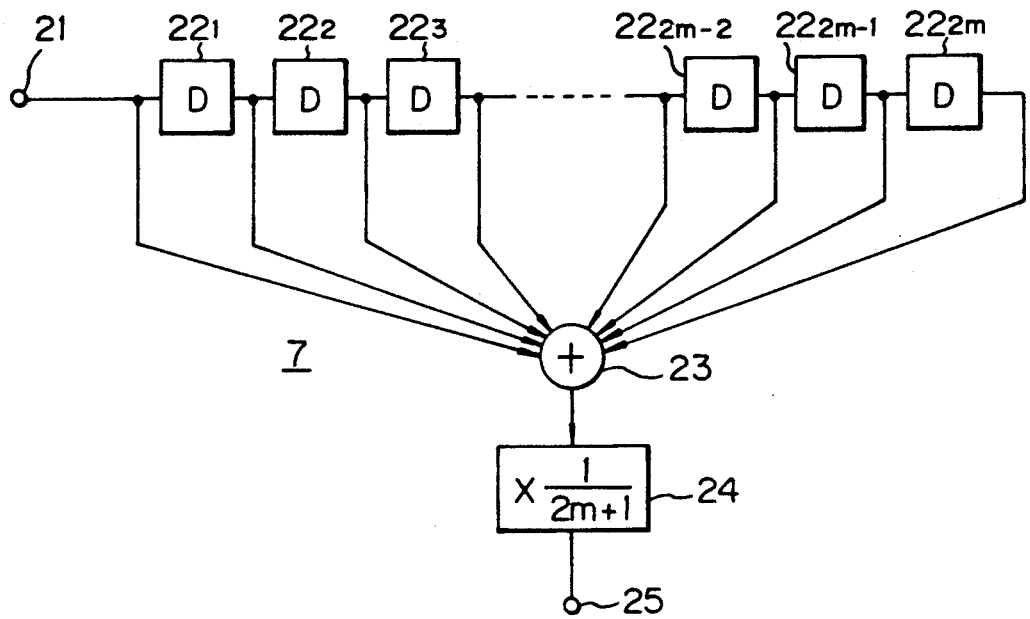
FIG. 6 is a block diagram of an averaging low pass filter for use in the embodiment of FIG. 4.

With reference now to FIG. 6, it will be seen that, in accordance with a first embodiment of the invention, the out-of-focus approximating low pass filter 7 of the filter circuit 6 is illustrated as an N stage (2m) digital low pass filter. A transfer function H(z) of the N stage (2m) digital low pass filter 7 may be expressed as:

$$H(z) = \frac{1}{2m+1}(1 + z^{-1} + z^{-2} + \ldots + z^{-2m}) \cdot z^m \quad (1)$$

The averaging low pass filter 7 implements the above transfer function of equation (1), while eliminating the group delay correction factor $z^m$. In the embodiment of FIG. 6, one-sample long delay circuits $22_1$ to $22_{2m}$ totalling 2m stages are cascade connected, where (m) is an integer. An input terminal 21 is provided at one end of the cascade connection. Outputs from the delay circuits $22_1$ to $22_{2m}$ are supplied as inputs to an adding circuit 23. An output signal from the adding circuit 23 is supplied to a multiplying circuit 24 which is operative to multiply the signal by a factor $(1/(2m+1))$, and to supply the multiplied signal to an output terminal 25 of the multiplying circuit 24.

Figure 7:
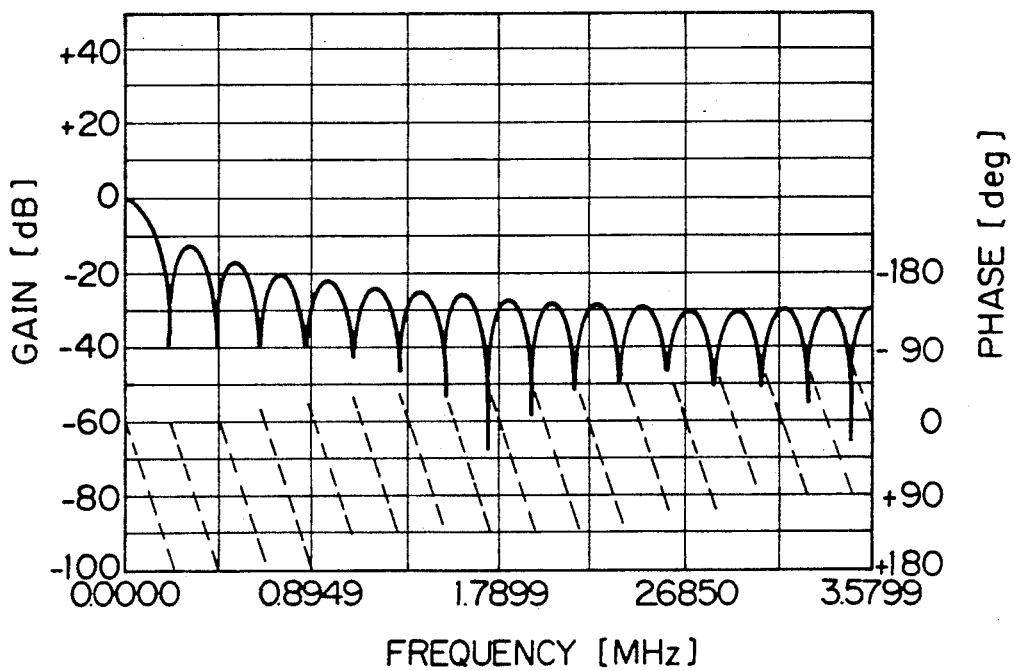
FIG. 7 is a frequency characteristic diagram for use in explaining the operation of the averaging low pass filter of FIG. 6.

FIG. 7 shows the typical frequency characteristics of such a digital averaging low pass filter. In this example, it is assumed that $(2m+1)=33$. In FIG. 7, a solid line indicates an amplitude characteristic while a broken line shows a phase characteristic.

Figure 8:
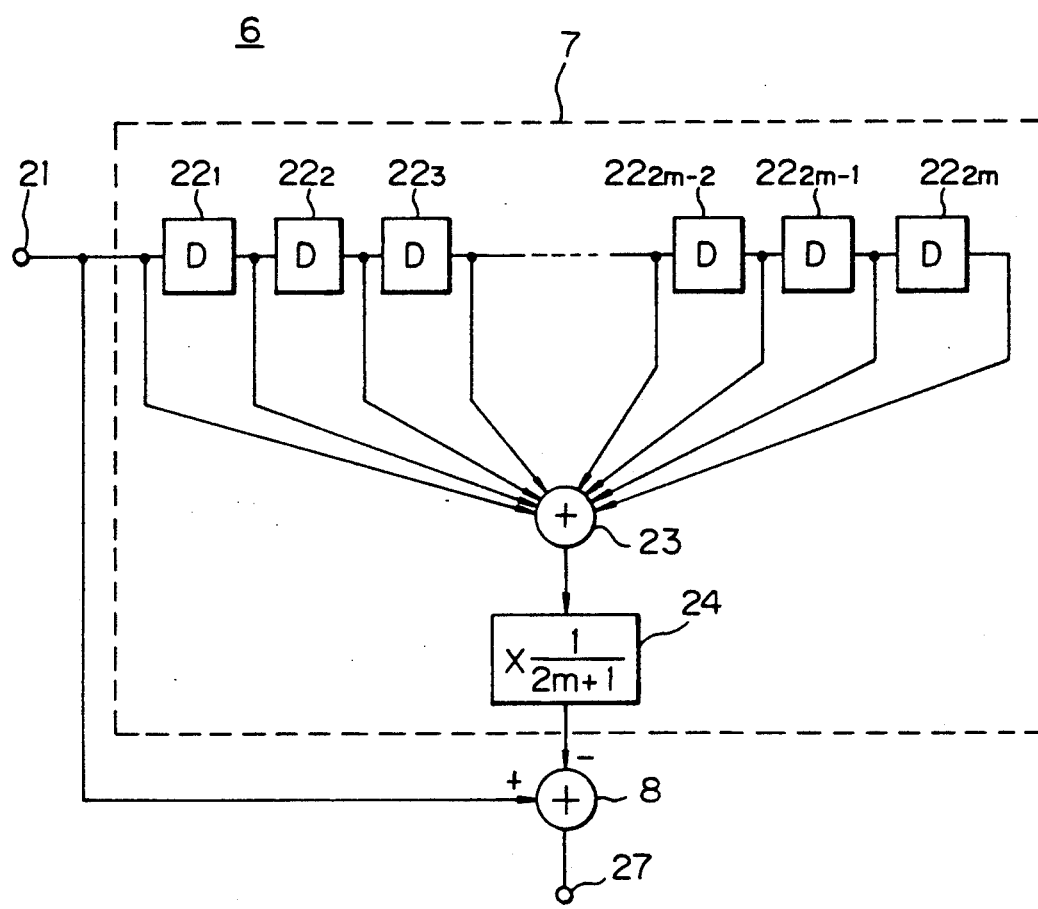
FIG. 8 is a block diagram of a filter circuit utilized in the embodiment of FIG. 4.

With reference now to FIG. 8, it will be seen that, when the filter circuit 6 of FIG. 4 includes the digital averaging low pass filter 7 shown in FIG. 6, such filter circuit 6 may be completed simply by subtractively combining the input and output signals of the filter 7. More specifically, in the filter circuit 6 of FIG. 8, a signal from the input terminal 21 of filter 7 is supplied to a noninverting input terminal of the subtracting circuit 8 and to the input of the filter circuit 7 whose output is supplied to an inverting input terminal of the subtracting circuit 8. Accordingly, the subtracting circuit 8 subtracts an output signal of the low pass filter 7 from the signal supplied to input terminal 21, and an output of the subtracting circuit 8 is supplied to an output terminal 27 of the filter circuit 6.

Second Embodiment of a Filter Circuit

In the digital averaging filter shown in FIG. 6, (2m) delay circuits $21_1$ to $22_{2m}$ are required together with an adding circuit 23 to add the outputs from the delay circuits $22_1$ to $22_{2m}$, which results in substantial circuit complexity. A relatively less complex high pass filter suitable for use as the filter circuit 6 of FIG. 4 may be obtained by implementing a transfer function derived by subtracting the terms on the right side of equation (1) from 1, as follows $$H(z) = 1 - \left[ \frac{1}{2m+1} (1 + z^{-1} + z^{-2} + \ldots + z^{-2m}) \cdot z^m \right] \quad (2)$$

The equation (3) can be rearranged to the following form:

$$H(z) = \frac{1}{2m+1} \left[ (2m+1)z^{-m} - \frac{1 - z^{-(2m+1)}}{-z^{-1}} \right] z^m \quad (3)$$

Figure 9:
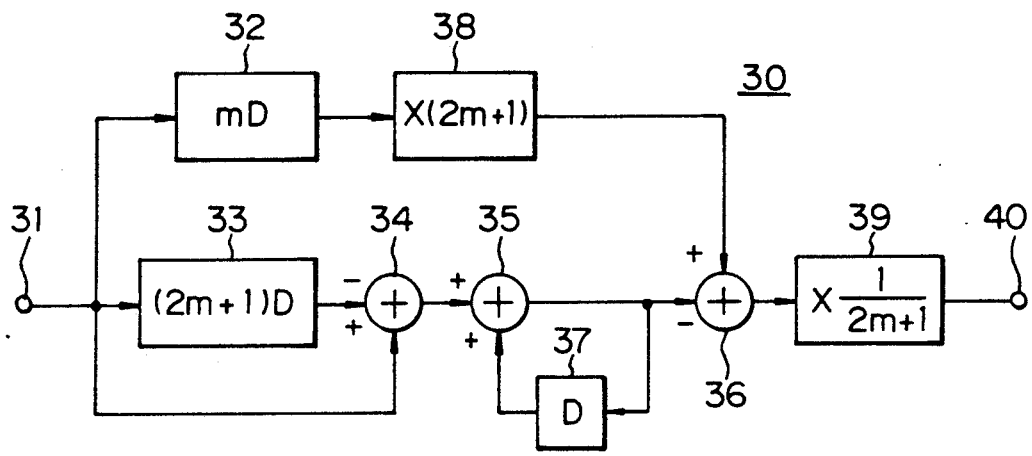
FIG. 9 is a block diagram of a filter circuit in accordance with a second embodiment of the present invention.

With reference to FIG. 9, a high pass filter 30 is illustrated therein which implements the transfer function of equation (3) and in one advantageous embodiment is substituted for the filter circuit 6 of the focusing system illustrated in FIG. 4. In the high pass filter 30 of FIG. 9, a digital signal from an input terminal 31 is supplied to an m-sample long delay circuit 32 as well as to a (2m+1) sample long delay circuit 33 and a noninverting input of a subtracting circuit 34.

An output of the (2m+1) sample long delay circuit 33 is supplied to an inverting input of the subtracting circuit 34. An output of the subtracting circuit 34 is supplied to a first input of an adding circuit 35. An output of the adding circuit 35 is supplied to an inverting input of a subtracting circuit 36 and is also fed back to a second input of the adding circuit 35 through a one-sample long delay circuit 37. Accordingly, adding circuit 35 and delay circuit 37 together serve to integrate the signal supplied to the first input of the adding circuit 35.

An output of the m-sample long delay circuit 32 is supplied to an input of a (2m+1) multiplying circuit 38. An output of the (2m+1) multiplying circuit 38 is supplied to a noninverting input of the subtracting circuit 36. An output of the subtracting circuit 36 is supplied to an input of a (1/(2m+1)) multiplying circuit 39 which provides an output signal to an output terminal 40 of the filter 30.

Figure 10:
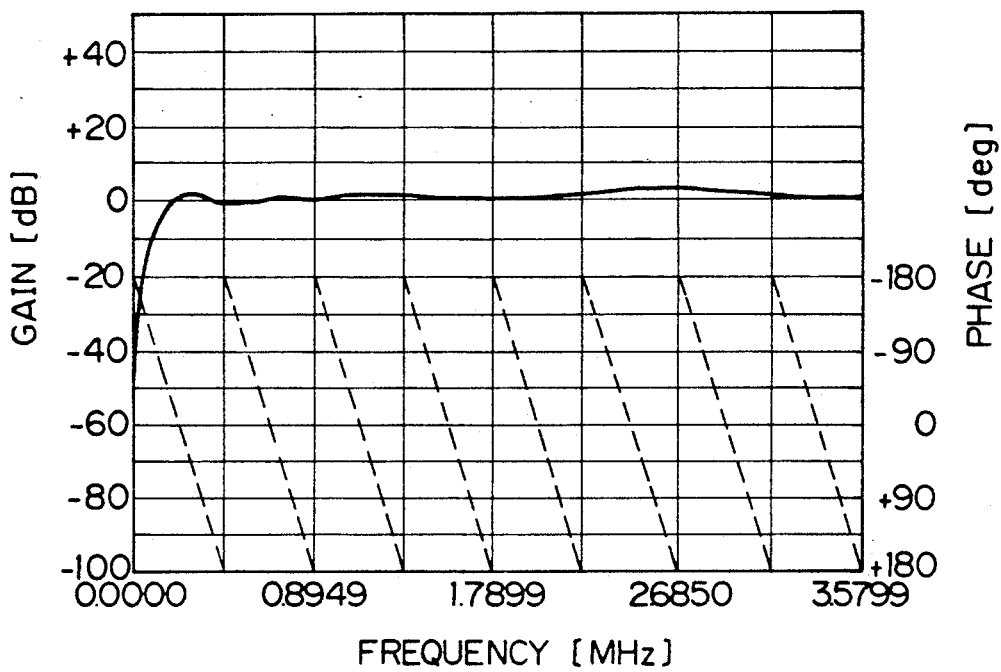
FIG. 10 is a frequency characteristic diagram for use in explaining the operation of the embodiment of FIG. 9.

With reference now to FIG. 10, the characteristics of a digital high pass filter having the transfer function of equation (2) or (3) are illustrated wherein it is assumed that (2m+1)=33. In FIG. 10, a solid line indicates amplitude characteristics and a broken line represents phase characteristics.

Third Embodiment of a Filter Circuit

Figure 11:
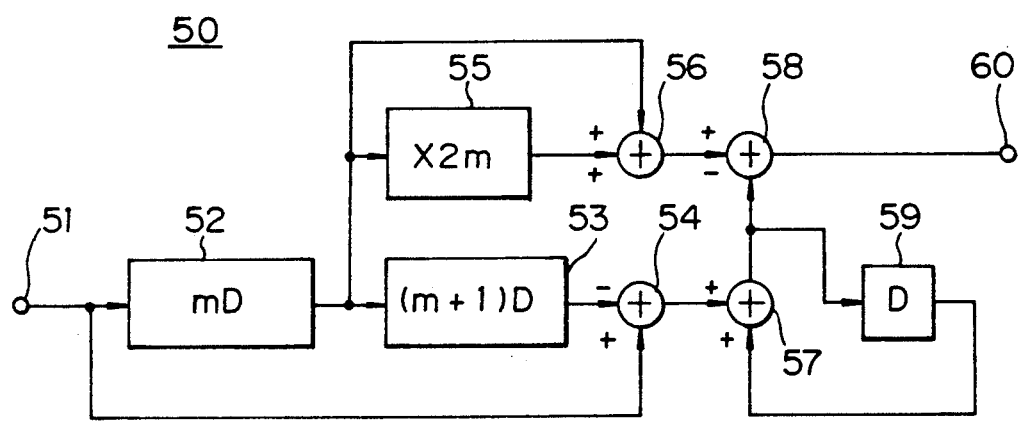
FIG. 11 is a block diagram of a filter circuit in accordance with a third embodiment of the present invention.

With reference to FIG. 11, a further, simplified embodiment of a high pass filter is illustrated in the form of a filter 50 comprising an m-sample long delay circuit 52 and an (m+1) sample long delay circuit 53 which are cascade connected. An input digital signal from an input terminal 51 of the filter 50 is supplied to the input of delay circuit 52 and to a noninverting input of a subtracting circuit 54. The output of delay circuit 53 is supplied to an inverting input of the subtracting circuit 54.

An output from the m-sample long delay circuit 52 is supplied to a first input of an adding circuit 56 and to the input of a multiplying circuit 55 which is operative to multiply the input signal by a coefficient (2m). The 2m-multiplying circuit 55 comprises a bit shift circuit. An output of the multiplying circuit 55 is supplied to a second input of the adding circuit 56. An output of the adding circuit 56 is supplied to a non-inverting input of a subtracting circuit 58.

An output of the subtracting circuit 54 is supplied to a first input of an adding circuit 57. An output of the adding circuit 57 is supplied to an inverting input of the subtracting circuit 58 and also is fed back to a second input of the adding circuit 57 through a one-sample long delay circuit 59, so that adding circuit 57 and delay circuit 59 together act as an integrator. Registers (not shown for purposes of simplicity and clarity) are provided for latching the outputs of subtracting circuit 54 and adding circuits 56 and 57. An output of the subtracting circuit 58 is provided to an output terminal 60 of the filter 50.

The filter 50 of FIG. 11 is relatively less complex than the filter 30 of FIG. 9 and is better adapted for achieving high speed operation. The filter 50 of the FIG. 11 embodiment does not require the (1/(2m+1)), multiplier 39, since it merely affects the overall gain factor of the circuit 30. However, unlike the multiplying circuit 39, the multiplying circuit 38 is positioned in only one branch of the filter 30. Multipliers are relatively complex circuits and tend to have low operating speeds. Nevertheless, the filter 50 of FIG. 11 achieves improved operating speed and reduced circuit complexity by achieving the (2m+1) multiplying of circuit 38 through the combination of a 2m-bit shifting circuit 55 and an adding circuit 56.

The (2m+1) sample long delay circuit 33 of the filter 30 is replaced in the filter 50 by the cascade connection of the m-sample long delay circuit 52 and the (m+1) sample long delay circuit 53. Accordingly, by supplying an output at the point where the m-sample long delay circuit 52 connects to the (m+1) sample delay circuit 53, the required input to the (2m+1) multiplying circuit is provided and the m-sample long delay circuit 32 of the filter 30 is omitted in the filter 50 thereby further simplifying the latter.

Fourth Embodiment of a Filter Circuit

Figure 12:
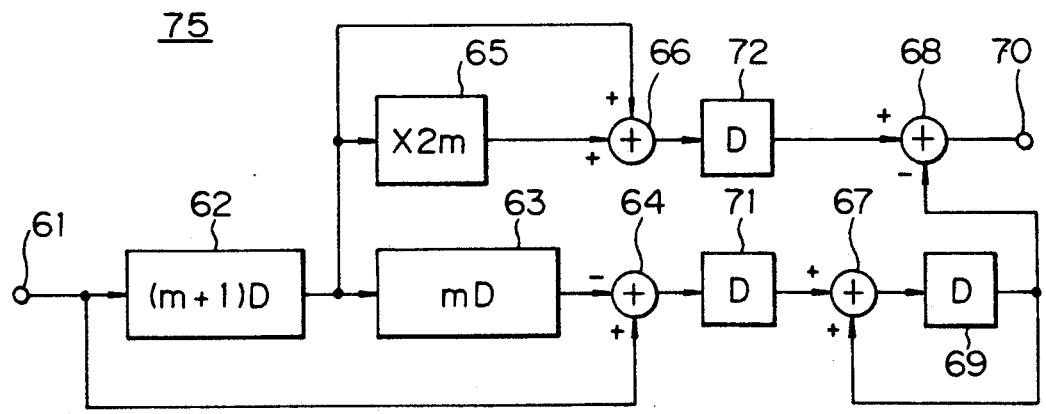
FIG. 12 is a block diagram of a filter circuit in accordance with a fourth embodiment of the present invention.

Referring now to FIG. 12, a still further embodiment of a digital high pass filter is illustrated in the form of a filter circuit 75. In filter circuit 75, an (m+1) sample long delay circuit 62 and an m-sample long delay circuit 63 are cascade connected. An input digital signal from an input terminal 61 is supplied to a noninverting input of a subtracting circuit 64 and is also supplied to an inverting input of the subtracting circuit 64 through the (m+1) sample long delay circuit 62 and the m-sample long delay circuit 63.

An output from the (m+1) sample long delay circuit 62 is supplied to a first input of an adding circuit 66 and to a 2m-multiplying circuit 65 which advantageously comprises a bit shift circuit. An output of the multiplying circuit 65 is supplied to a second input of the adding circuit 66. An output of the adding circuit 66 is supplied to an input of a one-sample long delay circuit 72 and an output of the one-sample long delay circuit 72 is supplied to a noninverting input terminal of a subtracting circuit 68.

An output of the subtracting circuit 64 is supplied to an input of a one-sample long delay circuit 71. An output of the one-sample long delay circuit 71 is supplied to a first input of an adding circuit 67. An output of the adding circuit 67 is supplied to an input of a one-sample long delay circuit 69. An output of the one-sample long delay circuit 69 is fed back to a second input of the adding circuit 67 and is also supplied to an inverting input of the subtracting circuit 68 so that adding circuit 67 and delay circuit 69 together act as an integrator. An output of the subtracting circuit 68 is provided to an output terminal 70 of the filter circuit 75.

The filter circuit 75 of FIG. 12 achieves further hardware simplification compared with the filter circuit 50 of FIG. 11. In the filter circuit 50 of FIG. 11, as mentioned above, registers are employed to latch the outputs of the adding and subtracting circuits. Accordingly, in the filter circuit 50, there are actually provided, in addition to the components shown on FIG. 11, a one-sample long delay circuit arranged at the output of the subtracting circuit 54, a further one-sample long delay circuit arranged at the output of the adding circuit 56, and a still further one-sample long delay circuit arranged at the output of the adding circuit 57 and which are operative to latch said outputs. When the one-sample long delay circuit is arranged at the output of the adding circuit 57, a further one-sample long delay circuit for delay matching is required at the output of the adding circuit 56.

In the filter circuit 75 of FIG. 11, on the other hand, the output of the adding circuit 67 is supplied to the one-sample long delay circuit 69 and an output of the one-sample long delay circuit 69 is fed back to the adding circuit 67 and is also supplied to the subtracting circuit 68. Accordingly, in the circuit 75 of FIG. 12 the operations of delaying and feeding back the output of the adding circuit 57 and latching its output are both provided by a single one-sample long delay circuit 69 and the necessary matching one-sample delay is provided in the (m+1) sample delay circuit 62. Thus, the complexity of the FIG. 11 embodiment is further reduced in the embodiment of FIG. 12.

Like filter circuit 50, the filter circuit 75 of the FIG. 12 embodiment is suitable for use in the focusing system of FIG. 4 in place of the filter 6.

Fifth Embodiment of a Filter Circuit

Figure 13:
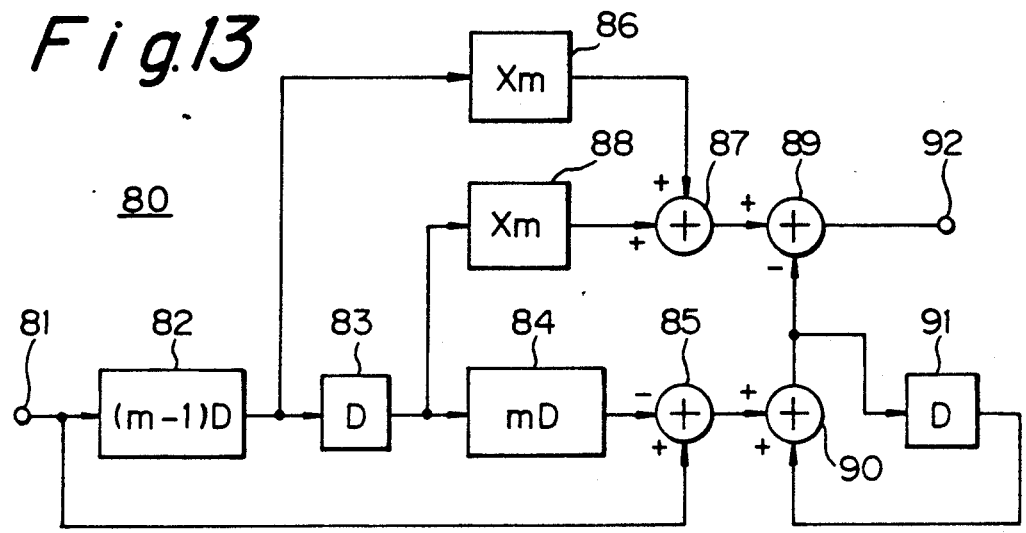
FIG. 13 is a block diagram of a filter circuit in accordance with a fifth embodiment of the present invention.

With reference now to FIG. 13, yet another embodiment of a high pass filter in accordance with the present invention is illustrated in the form of a filter circuit 80. In filter circuit 80, an (m−1) sample long delay circuit 82, a one-sample long delay circuit 83, and an m-sample long delay circuit 84 are cascade connected, in that order. An input digital signal applied at an input terminal 81 of the filter circuit 80 is supplied to a noninverting input of a subtracting circuit 85 and, after a (2m) sample long delay, is supplied to an inverting input of the subtracting circuit 85 through the cascade connected (m−1) sample long delay circuit 82, one-sample long delay circuit 83, and m-sample long delay circuit 84.

An output from the (m−1) sample long delay circuit 82 is supplied to a multiplying circuit 86 which is operative to multiply said output by a coefficient (m). The multiplying circuit 86 is advantageously comprised of a bit shift circuit. An output of the multiplying circuit 86 is supplied to a first input of an adding circuit 87.

An output from the one-sample delay circuit 83 is supplied to a multiplying circuit 88 which is operative to multiply said output by a coefficient (m). The multiplying circuit 88, like the multiplying circuit 86, is advantageously comprised of a bit shift circuit. An output of the multiplying circuit 88 is supplied to a second input of the adding circuit 87. An output of the adding circuit 87 is supplied to a noninverting input of a subtracting circuit 89.

An output of the subtracting circuit 85 is supplied to a first input of an adding circuit 90. An output of the adding circuit 90 is supplied to an inverting input of the subtracting circuit 89 and is also fed back to a second input of the adding circuit 90 through a one-sample long delay circuit 91, such that adding circuit 90 and delay circuit 91 together act as an integrator. Registers (not shown for purposes of simplicity and clarity) are provided for latching the outputs of subtracting circuit 85 and of adding circuits 87 and 90. An output of the subtracting circuit 89 is provided to an output terminal 92 of the filter circuit 80.

In the embodiments of FIGS. 11 and 12 mentioned above, a signal multiplied by a factor (2m) and the same signal which has not been multiplied are added by the adding circuits 56 and 66, respectively. The multiplying circuits 55 and 65 effect multiplication by (2m) through bit shifting and, as a consequence, the word length of the multiplied signal is longer than that of the unmultiplied signal to which it is added by the amount of the bit shift which was executed to effect multiplication. For instance, when m=16, the coefficient (2m) is 32, so that the multiplied signal is shifted by five bits and the data length is likewise increased by five bits. Accordingly, each of the adding circuits 56 and 66 must add signals of different word lengths which increases the complexity of the filter circuits 50 and 75.

In the embodiment of FIG. 13, since the word lengths of the signals which are added by the adding circuit 87 are almost equal, the circuitry can be further simplified with respect to that of the circuits 50 and 75 of FIGS. 11 and 12. This is achieved in the FIG. 13 embodiment by employing a digital high pass filter which has an order one stage lower than the order of filters 50 and 75 of FIGS. 11 and 12. The digital high pass filter of FIG. 13 is based on an N stage (2m) digital averaging low pass filter which has a transfer function H(z) whose order is one stage lower than the transfer function defined by equation (1) hereinabove and which takes the form:

$$H(z) = \frac{1}{2m}(1 + z^{-1} + \ldots z^{-(2m-1)}) \cdot z^{(m-(1/2))} \quad (4)$$

The high pass filter 80 of FIG. 13 is based on the low pass filter transfer function of H(z) of equation (4), to provide a high pass transfer function by subtracting the right side of equation (4) from 1, as follows:

$$H(z) = 1 - \left[\frac{1}{2m}(1 + z^{-1} + \ldots z^{-(2m-1)}) \cdot z^{(m-(1/2))}\right] \quad (5)$$

$$= \frac{1}{2m}\left(2mz^{-((2m-1)/2)} - \left(\frac{1-z^{-2m}}{1-z^{-1}}\right) \cdot z^{(m-(1/2))}\right)$$

The group delay factor $z^{(m-(\frac{1}{2}))}$ may be ignored since it represents an overall circuit gain. The term $(2mz^{-((2m-1)/2)})$ in part represents a delay of one-half of a sample period which is approximated in the present embodiment of the invention by the average of two sequential samples and given by:

$$(mz^{-((2m-2)/2)} + mz^{-((2m-0)/2)})/2 = (mz^{-(m-1)} + mz^{-m})/2 \quad (6)$$

This average value represents an estimated signal value occurring at a time intermediate to the two sequential samples used to estimate said average value.

The embodiment of FIG. 13 implements the approximation of equation (6) by multiplying the outputs of the $(m-1)$ sample long delay circuit 82 and of the one-sample long delay circuit 83 each by a factor (m) by means of the multiplying circuits 86 and 88, respectively, and then adding the outputs of the multiplying circuits 86 and 88 with the use of the adding circuit 87. The word lengths of the outputs from the multiplying circuits 86 and 88 provided as inputs to the adding circuit 87 are nearly equal which simplifies the construction of the adding circuit 87 and it is sufficient to set the word length of the adding circuit 87 to only one bit more than the number of bits in the input data.

Figure 14:
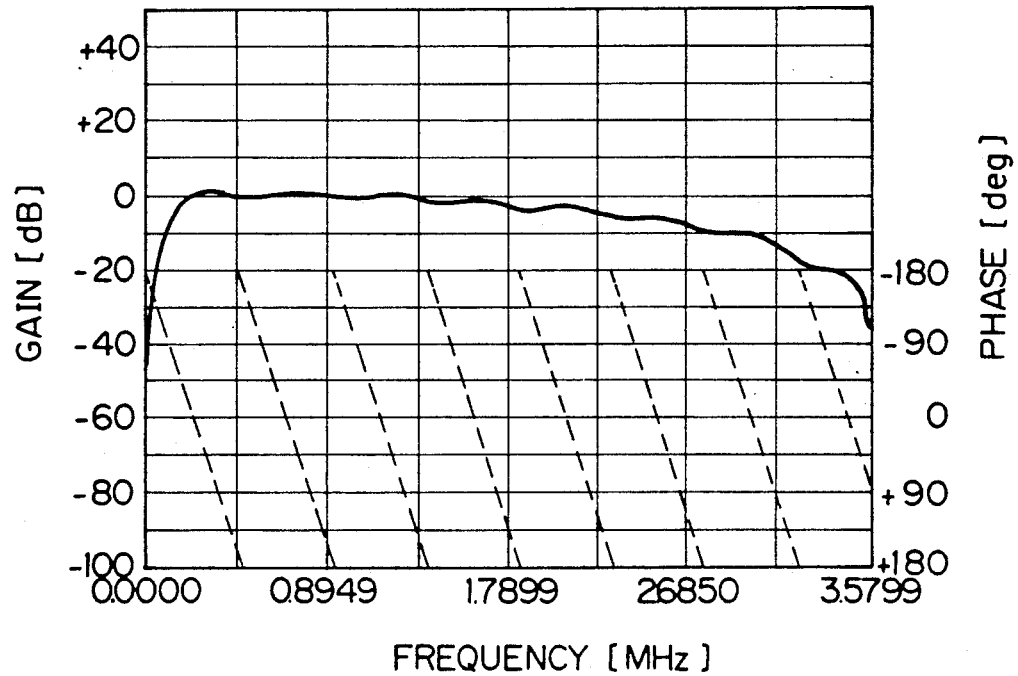
FIG. 14 is a frequency characteristic diagram for use in explaining the operation of the embodiment of FIG. 13.

Referring to FIG. 14, the characteristics for such a high pass filter are illustrated wherein it is assumed that $2m=32$. In FIG. 14, a solid line indicates amplitude characteristics and a broken line represents phase characteristics. It will be seen therein that certain high frequency components are lost. However, the characteristics of such a filter are acceptable for detecting mid-high frequency components of the video signal employed in the auto-focusing circuit of the present invention. Accordingly, the filter circuit 80, like those of the previously described embodiments, may serve in place of the filter circuit 6 in the auto-focusing circuit of FIG. 4.

Sixth Embodiment of a Filter Circuit

Figure 15:
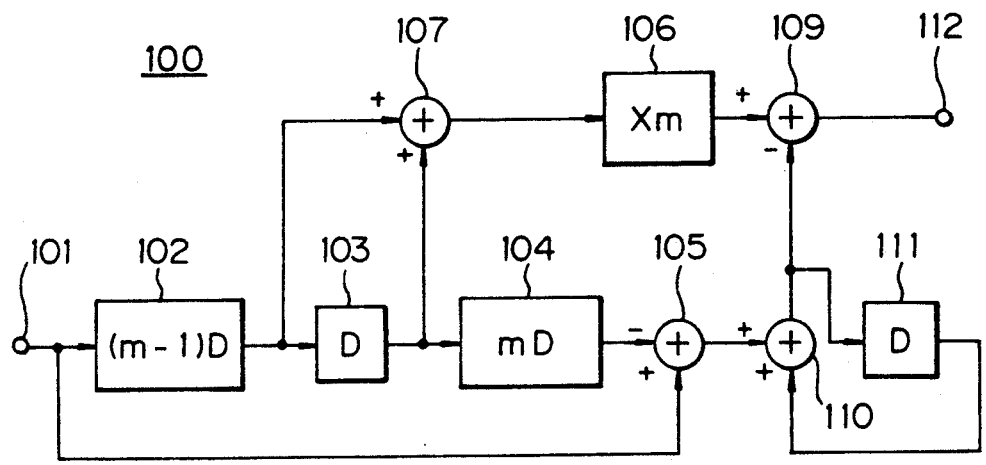
FIG. 15 is a block diagram of a filter circuit in accordance with a sixth embodiment of the present invention.

With reference now to FIG. 15 it will be seen that, in a filter circuit 100 in accordance with another embodiment of the present invention, an $(m-1)$ sample long delay circuit 102, one sample long delay circuit 103, and an m- sample long delay circuit 104 are cascade connected, in that order. An input digital signal from an input terminal 101 of the filter circuit 100 is supplied to a noninverting input of a subtracting circuit 105 and, after a (2m) sample long delay, is also supplied to an inverting input of the subtracting circuit 105 through the $(m-1)$ sample long delay circuit 102, one-sample long delay circuit 103, and m-sample long delay circuit 104.

An output of the $(m-1)$ sample long delay circuit 102 is supplied to one input of an adding circuit 107. An output of the one-sample long delay circuit 103 is supplied to a second input of the adding circuit 107. An output of the adding circuit 107 is supplied to a multiplying circuit 106 which is operative to multiply said output by a coefficient (m) and is advantageously comprised of a bit shift circuit. An output of the multiplying circuit 106 is supplied to the noninverting input of a subtracting circuit 109.

An output of the subtracting circuit 105 is supplied to a first input of an adding circuit 110. An output of the adding circuit 110 is supplied to an inverting input of the subtracting circuit 109 and is also fed back to a second input of the adding circuit 110 through a one sample long delay circuit 111, so that adding circuit 110 and delay circuit 111 together act as an integrator. Registers (not shown for purposes of simplicity and clarity) are provided for latching the outputs of subtracting circuit 105 and adding circuit 110. An output of the subtracting circuit 109 is provided to an output terminal 112 of the filter circuit 100.

In the filter circuit 100, the operations of the multiplying circuits 86 and 88 of the filter circuit 80 of FIG. 13 are carried out by the multiplying circuit 106, thereby reducing the amount of circuitry required in the circuit 100 over that of circuit 80.

Seventh Embodiment of a Filter Circuit

Figure 16:
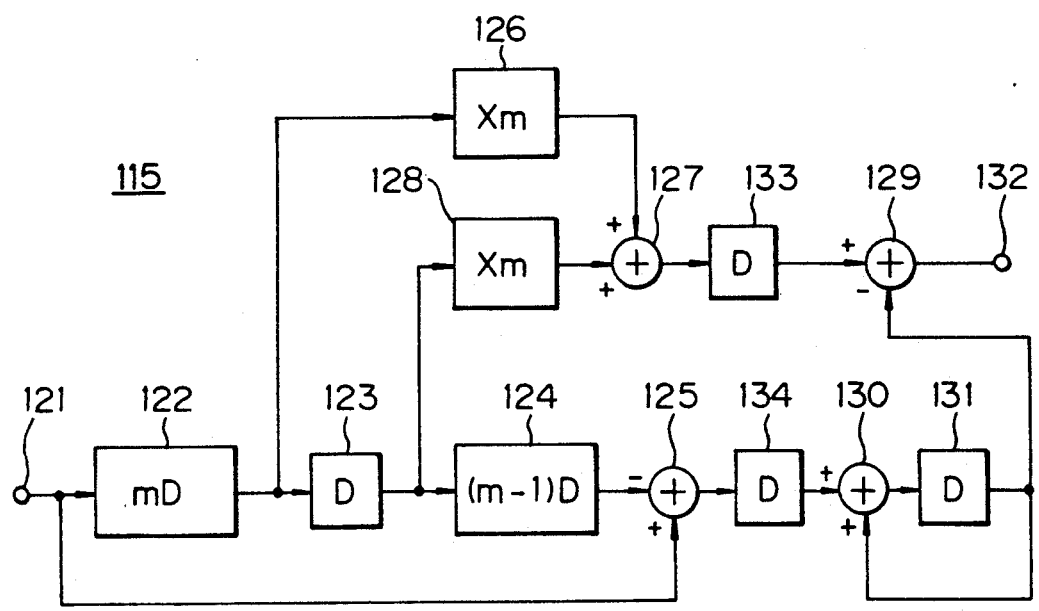
FIG. 16 is a block diagram of a filter circuit in accordance with a seventh embodiment of the present invention.

Referring now to FIG. 16, yet another embodiment of the present invention is shown in the form of a filter circuit 115. In filter circuit 115, an m-sample long delay circuit 122, a one-sample long delay circuit 123, and an $(m-1)$ sample long delay circuit 124 are cascade connected, in that order. An input digital signal from an input terminal 121 of the filter circuit 115 is supplied to a noninverting input of a subtracting circuit 125 and, after an m-sample long delay, is also supplied to an inverting input of the subtracting circuit 125 through the m-sample long delay circuit 122, one-sample long delay circuit 123, and $(m-1)$ sample long delay circuit 124.

An output of the m-sample long delay circuit 122 is supplied to a multiplying circuit 126 which is operative to multiply said output by a coefficient (m). An output of the multiplying circuit 126 is supplied to a first input of an adding circuit 127.

An output from the one-sample long delay circuit 123 is supplied to a multiplying circuit 128 which is operative to multiply said output by a coefficient (m). An output of the multiplying circuit 128 is supplied to a second input of the adding circuit 127.

An output of the adding circuit 127 is supplied to a one-sample long delay circuit 133 and an output thereof is supplied to a noninverting input of a subtracting circuit 129. An output of the subtracting circuit 125 is supplied to a one-sample long delay circuit 134 and an output thereof is supplied to a first input of an adding circuit 130. An output of the adding circuit 130 is supplied to an inverting input of the subtracting circuit 129 through a one-sample long delay circuit 131 and is also fed back to a second input of the adding circuit 130, such that adding circuit 130 and delay circuit 131 together act as an integrator. An output of the subtracting circuit 129 is provided to an output terminal 132 of the filter circuit 115 The filter circuit 115 also may be substituted for the filter circuit 6 of FIG. 4.

In the filter circuit of FIG. 16, the operations of a register to latch the output of the adding circuit 90 and the delay circuit to delay the output of the adding circuit 90 by one sample which are performed by separate circuit elements in FIG. 13, are both carried out by the delay circuit 131, thereby simplifying the circuit 115 with respect to the circuit 80 of FIG. 13.

Eighth Embodiment of a Filter Circuit

Figure 17:
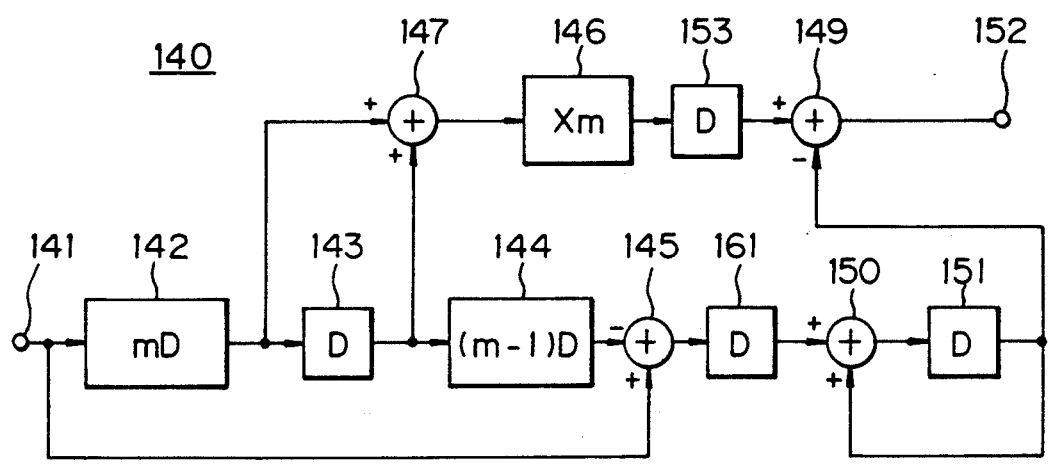
FIG. 17 is a block diagram of a filter circuit in accordance with an eighth embodiment of the present invention.

Referring now to FIG. 17, yet another embodiment of the present invention is illustrated therein in the form of a filter circuit 140. In the filter circuit 140, an m-sample long delay circuit 142, a one-sample long delay circuit 143, and an $(m-1)$ sample long delay circuit 144 are cascade connected, in that order. An input digital signal from an input terminal 141 is supplied to a noninverting input of a subtracting circuit 145 and, after a (2m) sample long delay, is also supplied to an inverting input of the subtracting circuit 145 through the m-sample long delay circuit 142, one-sample long delay circuit 143, and (m−11) sample long delay circuit 144.

An output of the m-sample long delay circuit 142 is supplied to a first input of an adding circuit 147 and an output of the one-sample long delay circuit 143 is supplied to a second input of the adding circuit 147. An output of the adding circuit 147 is supplied to a multiplying circuit 146 which is operative to multiply said output by a coefficient (m). An output of the multiplying circuit 146 is supplied to a one-sample long delay circuit 153 and an output thereof is supplied to a noninverting input of a subtracting circuit 149.

An output of the subtracting circuit 145 is supplied to a one-sample long delay circuit 161 and an output thereof is supplied to a first input of an adding circuit 150. An output of the adding circuit 150 is supplied to a one-sample long delay circuit 151. An output of the one-sample long delay circuit 151 is supplied to an inverting input of the subtracting circuit 149 and is also fed back to a second input of the adding circuit 150, such that adding circuit 150 and delay circuit 151 together act as an integrator. An output of the subtracting circuit 149 is provided to an output terminal 152 of the filter circuit 140.

It will be appreciated that the operations of a register to latch the output of the adding circuit 110 and the delay circuit 111 to delay the output of the adding circuit 110 by one sample period which are performed by separate circuit elements in FIG. 15, are carried out in the embodiment of FIG. 17 by the common delay circuit 151, thereby simplifying the circuit 140 with respect to the circuit 100 of FIG. 15

Figure 18A:
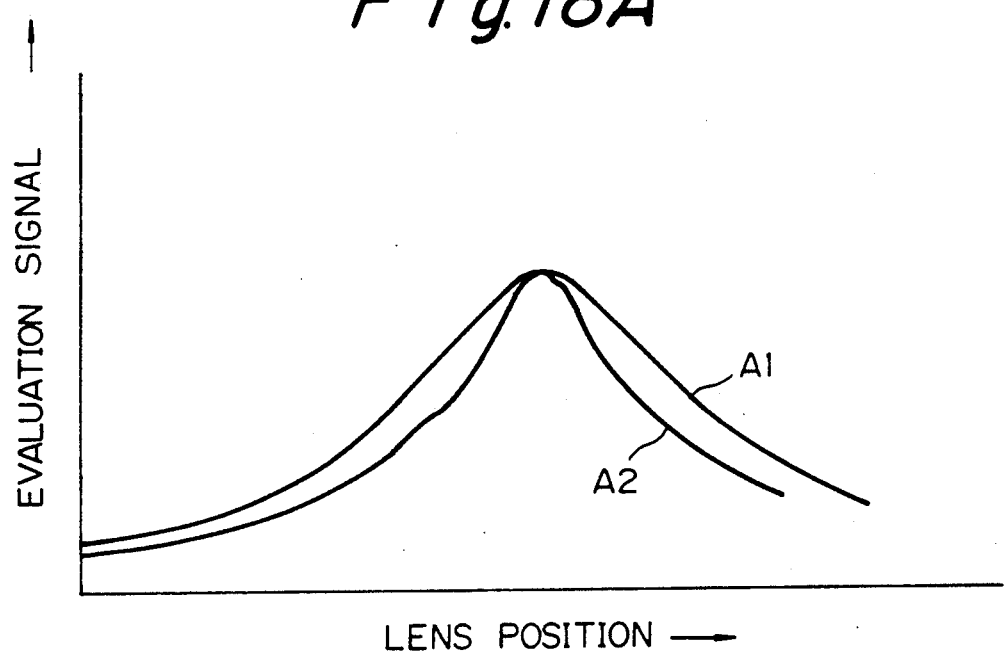
FIGS. 18A to 18C are graphs for explaining the operation of a focusing system in accordance with the present invention.
Figure 18B:
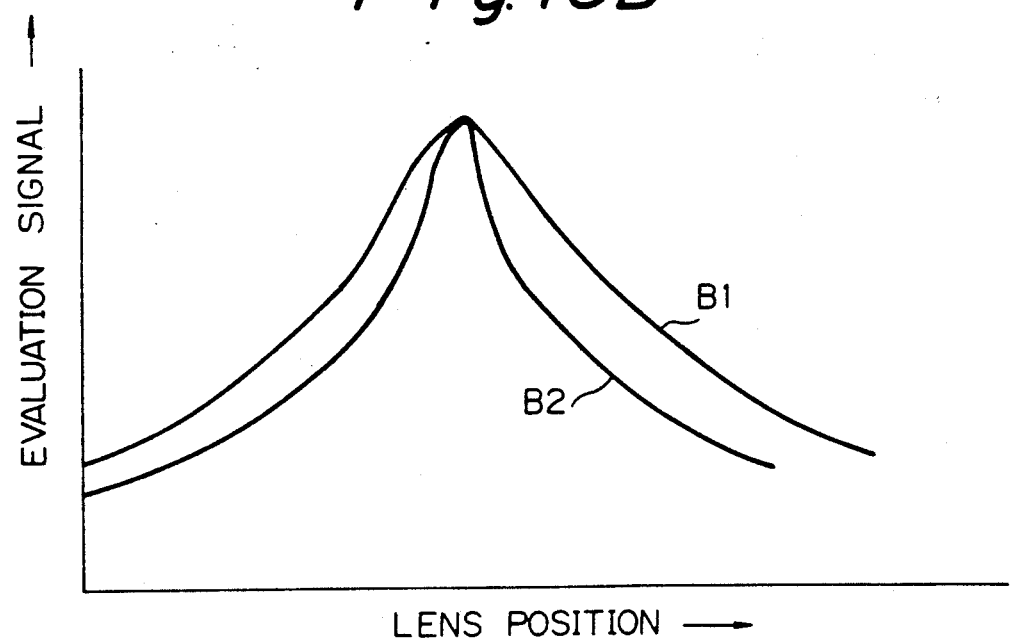
Figure 18C:
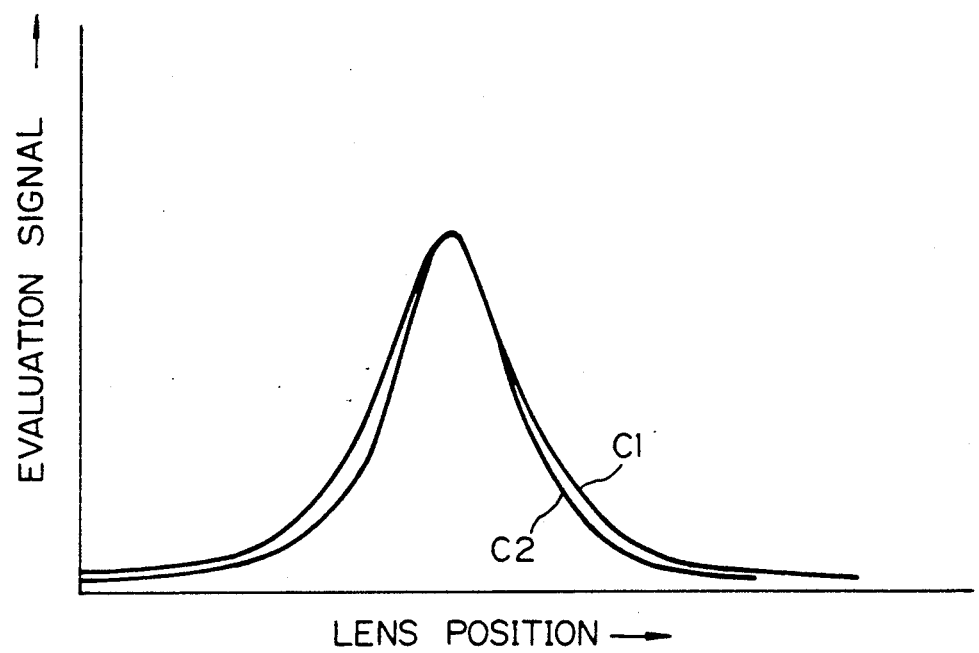

FIGS. 18A to 18C show comparisons of the curves of evaluation signals produced in a conventional auto-focusing circuit in which the evaluation signal is obtained by using an analog high pass filter with curves of evaluation signals obtained in accordance with the present invention.

FIG. 18A shows evaluation signal characteristics obtained in the case where a doll is used as an object to be imaged. In FIG. 18A, A2 identifies a curve of an evaluation signal obtained with the use of a conventional auto-focusing circuit and A1 indicates the curve of an evaluation signal obtained with the use of an auto-focusing circuit in accordance with the present invention.

Figure 19:
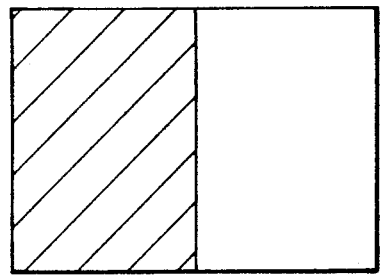
FIGS. 19 and 20 are image pattern diagrams which are used to illustrate objects used in producing the graphs of FIGS. 18A to 18C.

FIG. 18B illustrates evaluation signal characteristics obtained in the case where a flat picture whose left side is black and right side is white, as shown in FIG. 19, is used as an object to be imaged. In FIG. 18B, B2 denotes a curve of the evaluation signal obtained with the use of a conventional auto-focusing circuit and B1 indicates a curve of the evaluation signal obtained with the use of an auto-focusing circuit in accordance with the present invention.

Figure 20:
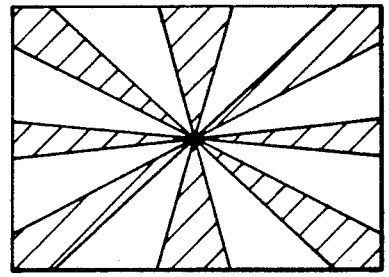

FIG. 18C shows evaluation signal characteristics in the case where a flat picture of radiating pattern, as shown in FIG. 20, is used as an object to be imaged. In FIG. 18C, C2 denotes the curve of an evaluation signal obtained with the use of a conventional auto-focusing circuit and C1 indicates the curve of an evaluation signal obtained with the use of an auto-focusing circuit in accordance with the present invention.

In FIGS. 18A to 18C, the characteristic curves of evaluation signals indicated at A1, B1 and C1 were produced with the use of a filter circuit comprising an out-of-focus function approximating low pass filter and a subtracting circuit in accordance with the present invention. It will be seen that, through the use of the present invention, the inclination of the I0 characteristic curve of the evaluation signal more nearly approaches a constant value and, accordingly, approximates an ideal characteristic curve for implementing an autofocus system of a video camera.

According to the present invention, a filter circuit for extracting predetermined frequency components of a video signal is provided comprising an out-of-focus function approximating low pass filter and a subtracting circuit. By using such a filter circuit to extract predetermined frequency components in the video signal in an autofocus system, the curve of the evaluation signal characteristics more nearly approaches an ideal configuration so that peak detecting control is facilitated and an in-focus lens position can be achieved throughout a wide range.

Having described certain preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

What is claimed is:

1. A focusing control apparatus for a video camera in which middle high frequency components in a video signal are maximized and are detected for focusing, comprising:

lens means for focusing an image;
motive means for moving said lens means;
image pickup means for converting light from said lens means into electrical signals;
signal processing means for processing the electrical signals from said image pickup means to obtain an analog luminance signal;
analog to digital converter means for converting the analog luminance signal from said signal processing means into a digital luminance signal;
filter means including a low pass filter having a transfer characteristic approximating that of said lens means when the latter is out of focus and to which said digital luminance signal is supplied, and subtracting means for subtracting signal components which pass through said low pass filter from said digital luminance signal so as to produce a filtered output signal;
detecting means for detecting the level of said filtered output signal and providing a corresponding detected output signal;
integrating means for integrating said detected output signal and providing an integrated output signal;
driving means for driving said motive means in accordance with a control signal; and
control means responsive to said integrated output signal for providing said control signal to said driving means such that said lens means is positioned to maximize said integrated output signal.

2. A focusing control apparatus according to claim 1, wherein said filter means comprises:

a cascade connection of an (m) sample long delay circuit and an (m+1) sample long delay circuit;

first subtracting circuit means for forming an output representing the difference of said digital luminance signal and a preceding value thereof transmitted through said cascade connection of the (m) sample long delay circuit and the (m+1) sample long delay circuit;

multiplying means for multiplying an output signal from a common node of the (m) sample long delay circuit and the (m+1) sample long delay circuit by a coefficient (2m);

first adding means for adding the output signal from the common node of the (m) sample long delay circuit and the (m+1) sample long delay circuit and an output signal of said multiplying means;

second adding means having a first input coupled to receive the output of said first subtracting means, a second input, and an output;

a one-sample long delay circuit having an input coupled with the output of the second adding means and an output coupled with said second input of said second adding means; and second subtracting circuit means for subtracting an output signal of said first adding means and an output signal of said second adding means to provide said filtered output signal.

3. A focusing control apparatus according to claim 1, wherein said filter means comprises:

a cascade connection of an (m+1) sample delay circuit and an (m) sample long delay circuit;

first subtracting circuit means for subtracting said digital luminance signal and a preceding value thereof transmitted through said cascade connection of the (m+1) sample delay circuit and the (m) sample long delay circuit;

first one-sample delay means for latching an output signal of said first subtracting circuit means;

multiplying means for multiplying an output signal from a common node of the (m+1) sample long delay circuit and the (m) sample long delay circuit by a coefficient (2m);

first adding means for adding the output signal from the common node of the (m+1) sample long delay circuit and the (m) sample delay circuit and an output signal of said multiplying means;

second one-sample delay means latching an output signal of said first adding means;

second adding means for adding signals received at first and second inputs thereof to produce an output signal at an output thereof representing the sum of the input signals, said first input receiving said signal latched by the second one-sample delay means;

third one-sample delay means coupled with the output of the second adding means for latching the output signal thereof and having an output coupled with the second input of said second adding means; and second subtracting circuit means for subtracting an output signal of said third one-sample delay means and an output signal of said second one-sample delay means to provide said filtered output signal 4. A focusing control apparatus according to claim 1, wherein said filter means comprises:

a cascade connection of an (m−1) sample delay circuit, a first one sample delay circuit and an (m) sample delay circuit;

first multiplying means for multiplying a signal provided at a common node of said (m−1) sample delay circuit and said first one-sample delay circuit by a coefficient (m);

second multiplying means for multiplying a signal provided at a common node of said first one-sample delay circuit and said (m) sample delay circuit by a coefficient (m);

first subtracting circuit means for subtracting said digital luminance signal and a preceding value thereof transmitted through said (m−1) sample delay circuit, said first one-sample delay circuit and said (m) sample delay circuit;

first adding means for adding an output signal of said first multiplying means and an output signal of said second multiplying means;

second adding means for adding signals received at first and second inputs thereof to produce an output signal at an output thereof representing the sum of the input signals, said first input of the second adding means being coupled to receive an output signal of said first subtracting circuit means;

a second one-sample delay circuit coupled with the output of the second adding means for delaying the output thereof by one-sample period and providing said one-sample period delayed output to the second input of said second adding means; and second subtracting circuit means for subtracting an output signal of said first adding means and an output signal of said second adding means to provide said filtered output signal.

5. A system for providing a focusing signal for use with an optical device having a lens adapted to be positioned in response to said focusing signal for focusing an image transmitted therethrough, comprising:

image pickup means for converting an image from the lens into a video signal;

signal filtering means including a low-pass filter having a transfer characteristic approximating that of said lens when the latter is out of focus and to which said video signal is supplied, and subtracting means for subtracting signal components which pass through said low pass filter from said video signal so as to produce said focusing signal.

6. The system according to claim 5, further comprising integrating means for integrating said focusing signal.

7. The system according to claim 6, wherein said image pickup means is operative to produce an analog video signal; and further comprising analog to digital converter means for converting said analog video signal to a digital video signal, and means for supplying said digital video signal to said low pass filter and to said subtracting means.

8. A system for providing a focusing signal for use with an optical device having a lens adapted to be positioned in response to said focusing signal for focusing an image transmitted therethrough, comprising:

image pickup means for converting an image from the lens into a video signal;

low pass filtering means coupled to receive said video signal for attenuating high frequency components thereof to produce a low pass filtered signal having characteristics corresponding to characteristics of said image produced by said lens when it is out of focus; and means for subtracting said low pass filtered signal from said video signal to produce said focusing signal.

9. The system according to claim 8, further comprising:
analog to digital converter means for converting said video signal to a digital video signal; and
wherein said low pass filtering means comprises a digital averaging low pass filter receiving said digital video signal.

10. The system according to claim 5, further comprising analog to digital converter means for converting said video signal to a digital video signal; and
wherein said signal filtering means is of digital configuration for providing said focusing signal in a digital signal format based on said digital video signal.

11. A system for providing a focusing signal for use with an optical device having a lens adapted to be positioned in response to said focusing signal for focusing an image transmitted therethrough, comprising:
image pickup means for converting an image from the lens into a video signal;
analog-to-digital converting means for converting said video signal to a digital video signal; and
digital signal filtering means including
means for producing a first digital signal proportional to the difference between said digital video signal and a preceding value of said digital video signal delayed in time by (2m+1) sample periods with respect to said digital video signal, where (m) is an integer;
means for integrating said first digital signal to produce a second digital signal;
means for producing a third digital signal proportional to a value of said digital video signal delayed in time by (m) sample periods with respect to said digital video signal and multiplied by a coefficient (2m+1); and
means for adding said second digital signal and said third digital signal to produce said focusing signal.

12. The system according to claim 10, wherein said digital signal filtering means includes:
means for producing a first digital signal proportional to a difference between said digital video signal and a preceding value of said digital video signal delayed in time by (2m+1) sample periods with respect to said digital video signal;
means for integrating said first digital signal to produce a second digital signal;
means for producing a third digital signal proportional to a value of said second digital signal delayed in time by one sample period;
means for producing a fourth digital signal proportional to a value of said digital video signal delayed in time by (m+1) sample periods with respect to said digital video signal and multiplied by a coefficient (2m+1); and
means for adding said third digital signal and said fourth digital signal to produce said focusing signal.

13. The system according to claim 10, wherein said digital signal filtering means includes:
means for producing a first digital signal proportional to a difference between said digital video signal and a preceding value of said digital signal delayed in time by (2m) sample periods with respect to said digital video signal, where (m) is an integer;
means for integrating said first digital signal to produce a second digital signal;
means for producing a third digital signal proportional to (m) times a sum of a value of said digital video signal delayed by (m−1) sample periods and a value of said digital video signal delayed by (m) sample periods; and
means for adding said second digital signal and said third digital signal to produce said focusing signal.

14. The system according to claim 10, wherein said digital signal filtering means includes:
means for producing a first digital signal proportional to a difference between said digital video signal and a preceding value of said digital video signal delayed in time by (2m) sample periods with respect to said digital video signal, where (m) in an integer;
means for integrating said first digital signal to produce a second digital signal;
means for producing a third digital signal proportional to a value of said second digital signal delayed in time by one sample period;
means for producing a fourth digital signal proportional to a sum of a value of said digital video signal delayed by (m+1) sample periods multiplied by a coefficient (m) and a value of said digital video signal delayed by (m) sample periods multiplied by a coefficient (m); and
adding means for adding said third digital signal and said fourth digital signal to produce said focusing signal.

15. A digital signal filter for filtering a digital input signal, comprising:
means for producing a first digital signal proportional to a difference between said digital input signal and a preceding value of said digital input signal delayed in time by (2m+1) sample periods with respect to said digital input signal, where (m) is an integer;
means for integrating said first digital signal to produce a second digital signal;
means for producing a third digital signal proportional to a value of said input digital signal delayed in time by (m) sample periods with respect to said input digital signal and multiplied by a coefficient (2m+1); and
means for adding said second digital signal and said third digital signal to produce a filtered digital output signal.

16. A digital signal filter according to claim 15, wherein said means for producing a first digital signal and said means for producing a third digital signal share a common (m) sample period delay means; and
wherein said means for producing a third digital signal includes:
bit shifting means coupled with said common (m) sample period delay means to receive an (m) sample period delayed value of said digital input signal for providing an output signal proportional to said (m) sample period delayed value multiplied by a coefficient (2m); and
adding means for adding means said output signal of said bit shifting means and said (m) sample period delayed value to produce said third digital signal.

17. A focusing control apparatus for a video camera in which middle high frequency components in a video signal are maximized and detected for focusing, comprising:
lens means for focusing an image;
motive means for moving said lens means;
image pickup means for converting light from said lens means into electrical signals;

signal processing means for processing the electrical signals from said image pickup means to obtain an analog luminance signal;

analog to digital converter means for converting the analog luminance signal from said signal processing means into a digital luminance signal;

filter means including means for producing a first digital signal proportional to the difference between said digital luminance signal and a preceding value of said digital luminance signal delayed in time by (2m+1) sample periods with respect to said digital luminance signal, where (m) is an integer, means for integrating said first digital signal to produce a second digital signal, means for producing a third digital signal proportional to a value of said digital luminance signal delayed in time by (m) sample periods with respect to said digital luminance signal and multiplied by coefficient (2m+1), and means for adding said second digital signal and said third digital signal to produce a filtered output signal;

detecting means for detecting the level of said filtered output signal and providing a corresponding detected output signal;

integrated means for integrating said detected output signal and providing an integrated output signal;

driving means for driving said motive means in accordance with a control signal; and control means responsive to said integrated output signal for providing said control signal to said driving means such that said lens means is positioned to maximize said integrated output signal.

* * * * *